United States Patent [19]
Guthrie et al.

[11] Patent Number: 5,584,903
[45] Date of Patent: Dec. 17, 1996

[54] PERMEABLE ATTENUATING DISTRIBUTOR FOR A GLASS CONTAINER COATING APPARATUS AND A METHOD FOR COATING CONTAINERS

[75] Inventors: Roger T. Guthrie, Spartanburg, S.C.; Raymond W. Barkalow, Doylestown, Pa.

[73] Assignee: Elf Atochem North America, Inc., Philadelphia, Pa.

[21] Appl. No.: 203,053

[22] Filed: Feb. 18, 1994

Related U.S. Application Data

[63] Continuation-in-part of Ser. No. 718,501, Jun. 20, 1991, abandoned.

[51] Int. Cl.$^6$ ............................ C03C 17/00; C23C 16/04
[52] U.S. Cl. ............................ 65/60.1; 65/60.4; 65/60.5; 65/157; 65/168; 118/720; 427/255; 427/255.1
[58] Field of Search .................. 65/60.1, 60.4, 65/60.5, 60.51, 375, 30.1, 168, 157; 427/345, 424, 427, 226, 422, 407.2, 419.2, 255, 255.3, 255.1; 118/720, 314, 326, 324

[56] References Cited

U.S. PATENT DOCUMENTS

| | | | |
|---|---|---|---|
| Re. 28,076 | 7/1974 | Augustsson et al. | 118/720 |
| 3,323,889 | 6/1967 | Carl et al. | |
| 3,516,811 | 6/1970 | Gatchet et al. | |
| 3,561,940 | 2/1971 | Scholes | 118/720 |
| 3,690,289 | 9/1972 | Frank | 118/720 |
| 3,819,404 | 6/1974 | Scholes et al. | 118/48 |
| 4,220,118 | 9/1980 | Levene et al. | 118/720 |
| 4,389,234 | 6/1983 | Lindner | 65/60.1 |
| 4,431,692 | 2/1984 | Hofmann et al. | 65/60.51 |
| 4,529,627 | 7/1985 | Zürbig | 65/60.51 |
| 4,615,916 | 10/1986 | Henderson | 65/60.5 |
| 4,668,268 | 5/1987 | Lindner et al. | 65/60.1 |
| 4,879,970 | 11/1989 | Barkalow et al. | 118/314 |
| 5,081,953 | 1/1992 | Guthrie et al. | 427/255 |
| 5,136,976 | 8/1992 | Barkalow et al. | 427/255 |

*Primary Examiner*—Donald E. Czaja
*Assistant Examiner*—Steven P. Griffin
*Attorney, Agent, or Firm*—Stanley A. Marcus; Nicholas J. DeBenedictis

[57] ABSTRACT

Apparatus and method for coating hot glass bottles are improved by providing a controlled non-turbulent air supply directed downward across the coating material stream. The apparatus has a relocated blower for delivering process fluid (e.g. air) into an end of a plenum upper chamber, passing the air first through an permeable attenuator, then into a lower plenum chamber and finally through a diffuser plate to provide a uniform stream of process air directed downward across the coating-material stream into the finish region of the bottle. In the method, process air is blown to a plenum, through an angled attenuator plate with small holes to distribute the process air evenly and to avoid standing waves and regions of high or low air velocity. Several attenuator plates can be juxtaposed to permit removal of particulates by movement of the plates relative to each other. An iris or throttle valve after the blower can be used as an additional method of controlling the force and velocity of process air. A clean out is provided in the plenum through which the attenuator plates can be removed or cleaned. The method is improved by passing the air through an attenuator plate mounted at an angle to the flow of process fluid to provide a controlled non-turbulent air supply.

13 Claims, 4 Drawing Sheets

PERMEABLE ATTENUATING DISTRIBUTOR FOR A GLASS CONTAINER COATING APPARATUS AND A METHOD FOR COATING CONTAINERS

CROSS-REFERENCE TO RELATED APPLICATION

This application is a continuation-in-part of our application Ser. No. 07/718,501, filed Jun. 20, 1991, now abandoned.

BACKGROUND OF THE INVENTION

1. Field of the Invention

This invention is in the field of methods and apparatus for the application of coatings to glass containers. More particularly, the present invention is in the field of methods and devices for the application of coatings of varying thicknesses to bottles, jars and the like, where the distance between the closure region and the shoulder of the container is minimal.

2. Description of the Prior Art

The utility of glass bottles and jars has been broadened by surface coating to decrease abrasion and breakage, as taught by Carl, et al., U.S. Pat. No. 3,323,889; Gatchet, et al., U.S. Pat. No. 3,516,811; Scholes, et al., U.S. Pat. No. 3,819,404; Hofmann, et al., U.S. Pat. No. 4,431,692; Lindner, et al., U.S. Pat. Nos. 4,389,234 and 4,668,268; and others. Gatchet observed the utility of avoiding all coating on the closure region of the container, known in the art as the "finish", by maintaining the finish region out of contact with the treatment gas. Several of the prior workers in this field have recognized the existence of non-linear currents in the coating-precursor stream, including omnidirectional turbulent currents and upwardly-moving convection currents.

It is known in the art of glass manufacture that uncoated glass is generally unsuitable for handling in high-speed operations, its brittleness rendering the surface susceptible to potentially catastrophic damage. Specifically, bottles and other glass containers made in large numbers are susceptible to breakage in the course of being transferred through various manufacturing steps, or during a subsequent filling operation.

In order to minimize the problems thus encountered, a number of treatments have been applied to the containers as they are manufactured. Such treatments include, e.g., spraying with lubricant such as a wax or fatty acid, and applying reactive coatings by chemical-vapor-deposition (CVD) or spray-pyrolysis methods.

Treatment by CVD typically can involve propelling a vapor of metal-containing species onto the hot glass-container surface to produce a thin layer of metal oxide, typically stannic or titanic oxide, which anchors the waxy lubricant, added after annealing. Without the metal-oxide layer, such waxy lubricants do not adhere well to glass under the conditions encountered in a filling line.

In U.S. Pat. No. 4,668,268, assigned to the same assignee as the present invention, Lindner et al. teach the application of a metal-containing compound, generally an organotin material, to the surface of a glass container immediately after that container has acquired sufficient mechanical integrity to maintain its shape on a material-handling line. The Lindner et al. disclosure describes a coating hood for applying a uniform protective coating to a glass container as the container is transported by material-handling means, generally a conveyor belt, after its formation from molten glass. The described coating hood comprises a pair of side walls with a coating jet in at least one of the walls, and an exhaust system to remove the process stream from the coating zone.

In the field relating to the coating of containers generally and glass bottles specifically, one problem which is repeatedly encountered is that of applying adequate material to the body of the container while keeping the finish region of the container untreated. It is desirable to maintain the finish portion relatively free of coating material for both chemical and physical reasons. Where a tin compound is deposited on the screw threads of, for instance, a jar for holding baby food, the chemical, electrochemical or mechanical interaction between the metal cap and the coating may be sufficient to discolor the glass or to corrode the metal. Another disadvantage of coating on the finish is the possible effect on the frictional interaction between the glass and the cap or other closure; low friction can permit leakage, while too high a frictional value can impede both placement and removal of the closure. In either case, the utility of the treated container is adversely affected.

In the art of coating glass containers, the film deposited onto the glass surface is measured in arbitrary coating thickness units (CFU), the unit thickness being about 2.5 Angstroms (Å); metal-oxide coatings of from about 30 to 40 CTU, or about 60Å to 100Å, may be required for the body of the container, while acceptable coating on the finish may be one-half or even one-tenth of this amount, depending upon the ware and its intended use. While manufacturers of baby food state a preference for a finish-coating thickness of less than half that of the shoulder coating, proximity of finish to shoulder has heretofore made the desired separation difficult or impossible to achieve under the teachings of the prior art.

The improvement in the art which Lindner et al. provided in partial response to the problem of differential wall and finish thickness was accomplished by directing a stream of air in which no coating material was entrained onto the finish in order to displace and dilute coating material which would otherwise coat the finish region almost as much as the shoulder or the body of the container. By selection of the geometry of the coating hood as a function of the containers to be coated, Lindner et al. were able to effect acceptable coating thickness on the sidewalls, concomitant with protection of the finish for the large volume of glass containers having necks of appreciable length, such containers comprising beer, wine and soft-drink bottles and the like.

However, while the utility of the apparatus of the Lindner et al. patent is excellent for beer, wine and other bottles with relatively long necks, it is only marginal for applications such as food and cosmetic bottles and jars having very short or non-existent necks, i.e., where the finish region is juxtaposed adjacent the body. The latter group comprises, e.g., jam, jelly and cold-cream jars, and containers for baby foods, peanut butter, thixotropic salad dressings and the like. For the purposes of this specification, the terms "bottle" and "jar" may be used with substantial interchangeability, although generally, a jar has a relatively small separation of body and finish, while a bottle has a substantially larger separation.

While the most effective prior art directs the vapor-laden air stream horizontally at the label panel of the ware, and a stream of vapor-free air at the finish region, some of the coating stream has been found inevitably to be displaced toward the finish by conditions within the coating hood. Displacement can originate in, e.g., the shearing interaction between adjacent coating streams traversing the hood in opposite directions; in the turbulence caused by the ware as it crosses the coating streams; in the strong convection currents caused by hot ware moving through a coating stream that is typically hundreds of degrees cooler than the ware; and in the induced draft caused by the finish-protection stream. Further, even the best of the prior-art devices tend to require careful attention in order to maintain adjustment of the parameters required for an acceptable differential between the body or shoulder and the finish region.

SUMMARY OF THE INVENTION

This invention is an apparatus for the coating of glass containers having a minimal neck region, where the apparatus comprises a coating hood with a high-pressure portion and a juxtaposed low-pressure portion, having a center section for the introduction of air without coating precursor, and is an improvement which comprises a center section for the non-turbulent introduction of process fluid free of coating precursor, and traveling essentially perpendicular to the coating stream. The invention further includes the article made by the apparatus.

DESCRIPTION OF THE PREFERRED EMBODIMENTS

The preferred embodiment of the present invention is an improved apparatus for the application of glass-coating material to a glass container having a minimal separation between the body of the container and the top portion, the apparatus comprising coating-supply means, exhaust or recirculation means, a plurality of side walls with a coating jet in at least one of the walls, and an exhaust system to remove the process stream from the coating zone, wherein the improvement comprises fluid-stream-directing means juxtaposed above the container, the stream-directing means having at least a plenum and one attenuating plate, wherein the fluid within the plenum has minimal turbulence.

The improvement comprises apparatus for the direction of a process-fluid supply, generally air, perpendicularly across the stream of coating material, the process fluid being provided by pressurizing means to a plenum; an attenuator, mounted at an angle to the principal direction of flow of the fluid, distributes the process air evenly, to avoid turbulence, standing waves and regions of high or low air velocity.

Figure 1:
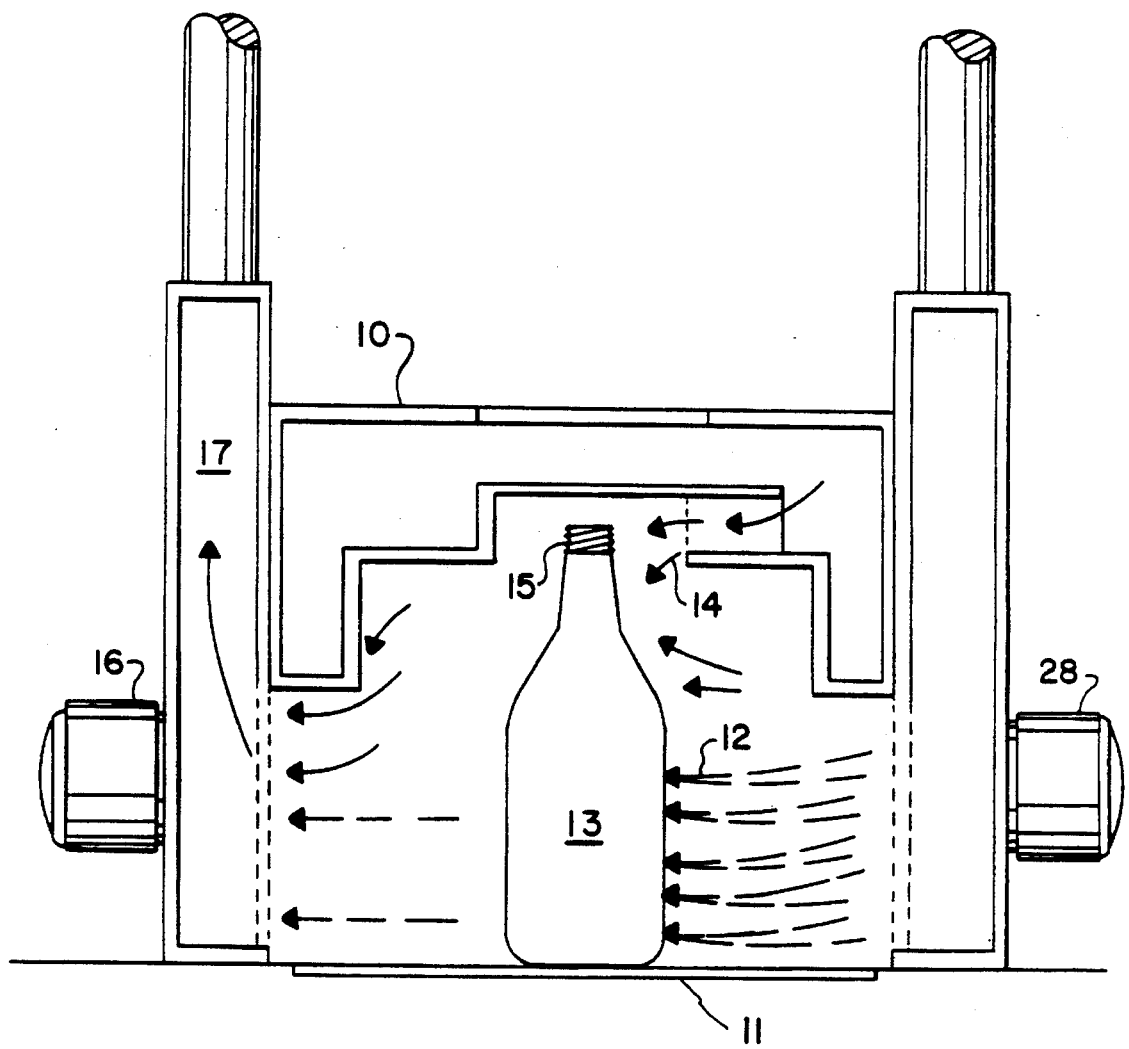
FIG. 1 is an elevation of apparatus of the prior art.

Turning now to the drawings, FIG. 1 is a sectional elevation of known apparatus 10 for maintaining a relatively low proportion of coating on the finish region 15 of bottle 13. Briefly described, a process stream 12 under pressure from supply blower 28 impinges upon bottle 13, the temperature of the surface of which is of the order of from about 350 to about 400 degrees Celsius; generally, bottle 13, moving toward the observer in a direction perpendicular to the plane of the drawing, has recently emerged from a forming machine, not shown. Deflection stream 14, flowing substantially in the same direction as process stream 12, is intended to keep stream 12 from depositing an undesirably thick coating of material on the finish 15 of bottle 13. Recirculation blower 16 maintains a low pressure within plenum 17 to cause process stream 12 to move onto and around bottle 13, thereby causing the coating precursor to react with the hot surface of the glass susubstrate. Other portions of this typical apparatus not germane to this invention are not further described here, being well within the understanding of one skilled in the art.

In the operation of the depicted coating-hood apparatus 10, process stream 12 is generally a mixture of glass-coating precursors such as, e.g., a volatile or finely dispersed tin or titanium compound in a carrier fluid such as, e.g., air or the like. Compounds which are useful with the apparatus of the present invention include those which are capable of reaction with air or other process-stream oxidizing moiety on the surface of the substrate to form a metal oxide, and comprise conveniently but not by way of limitation, materials such as organotin compounds generally, monobutyltin trichloride, tin tetrachloride, titanium tetrachloride and tetraisopropyl titanate.

Upon impinging on bottle 13, the organotin is converted to tin oxide as a coating on the glass surface. Volatile products and unreacted chemicals are recirculated by the action of blower 16. While the process stream 12 has a tendency toward turbulence on encountering bottle 13, deflection stream 14 maintains a zone which is essentially, but not perfectly, free of the coating precursor carried in stream 12. As a result, coatings secured by the prior-art apparatus provide a gradient of coating with a thickness of the order of 100Å on the body of the container to about 10Å in the finish region. However, in field application, it has not been possible to steepen the gradient, that is, to provide either more coating on the body or less on the finish, nor to apply the process of the apparatus in a consistently successful fashion to containers with necks shorter than about 25 millimeters.

Figure 2:
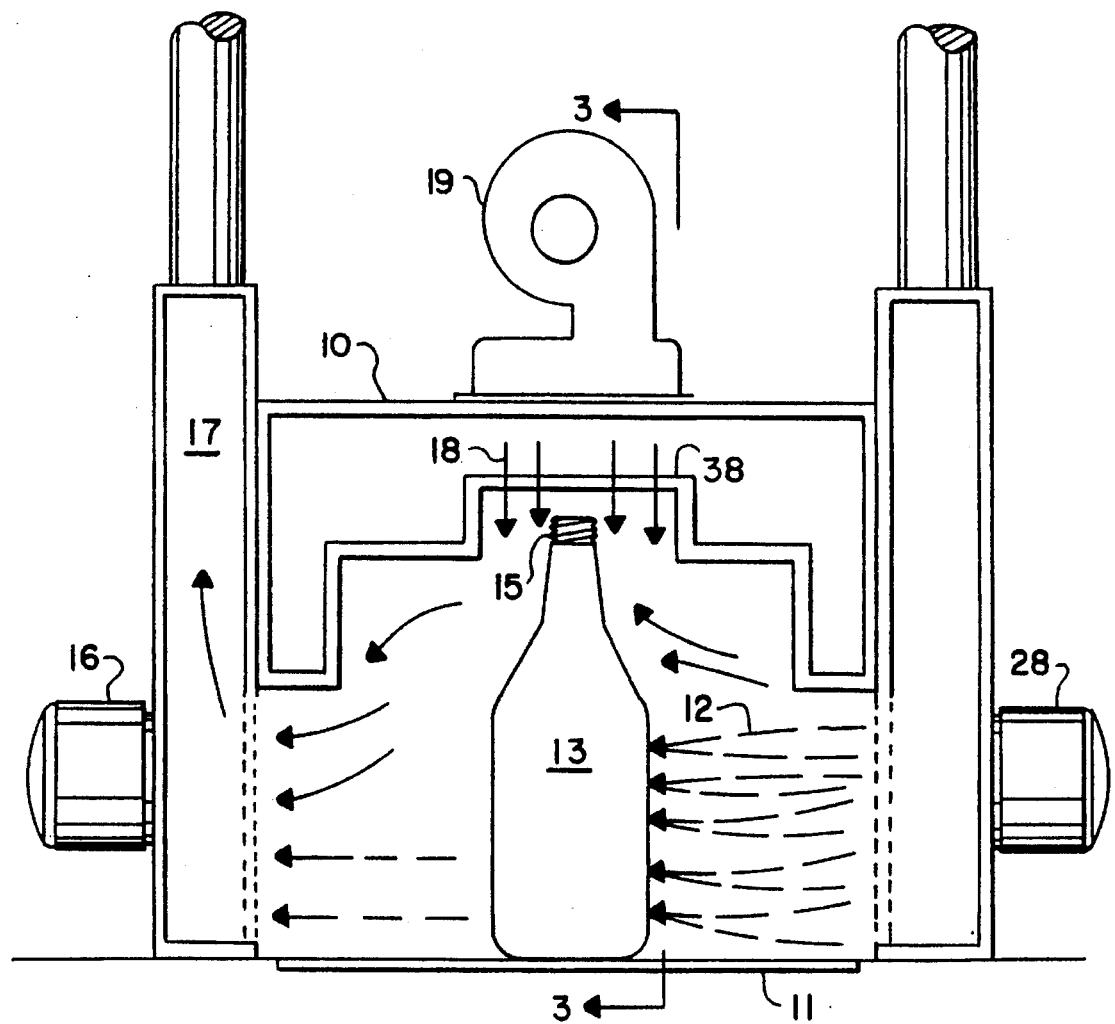
FIG. 2 is an elevation of a precursor to this invention.

We have discovered that by providing a substantially vertical stream of process fluid, generally air, directed in a fashion perpendicular to the coating stream, it is possible to keep the deposition of material on the finish to a practical minimum. However, the obvious approach to this solution, shown in FIG. 2, produced unacceptably variable results, limiting the utility of the invention to long-necked ware such as, e.g., beer and wine bottles and the like. In FIG. 2, blower 19 delivers air or other fluid through plenum 22 and diffuser plate 38 as vertical deflection stream 18 into the finish region 15 of bottles 13. Diffuser plate 38 contains a plurality of holes, and is designed to moderate the force of process fluid supplied by blower 19. In attempting to regulate the passage of air from plenum 22 through diffuser plate 38 into the treating zone, however, we discovered that the system caused the formation of standing waves and pressure nodes, causing the velocity of the protective stream 18 to vary along the length of the delivery apparatus. The nature of the problem is illustrated more fully in FIG. 3.

Figure 3:
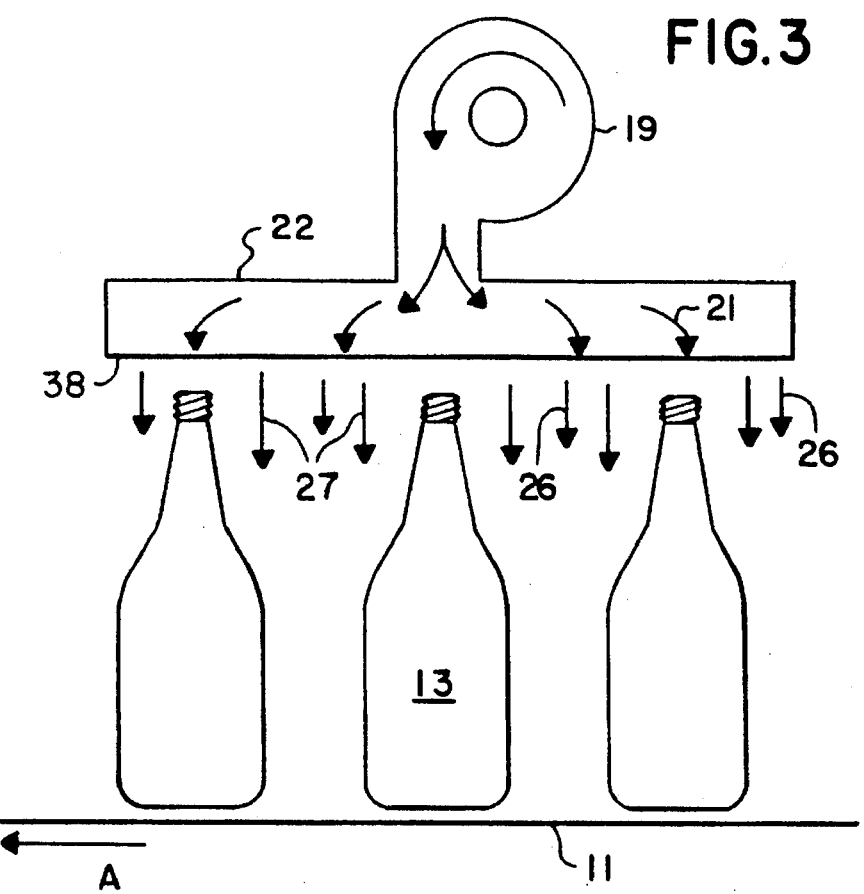
FIG. 3 is a section taken along lines 3—3 of FIG. 2.

FIG. 3 is a section taken along lines 3—3 of FIG. 2. Bottles 13 are shown moving on conveyor 11 in the direction marked by the arrow A. Depending on the size and geometry of plenum 22 and the velocity of process fluid 21 delivered by blower 19, standing waves represented vectorially by arrows 26 and 27 would develop in plenum 22, producing differential pressure throughout its length. As a result of the difference in pressure, the velocity of vertical deflection stream 18 would vary from point to point throughout the coating apparatus, making precise control of that stream extremely difficult.

Figure 4:
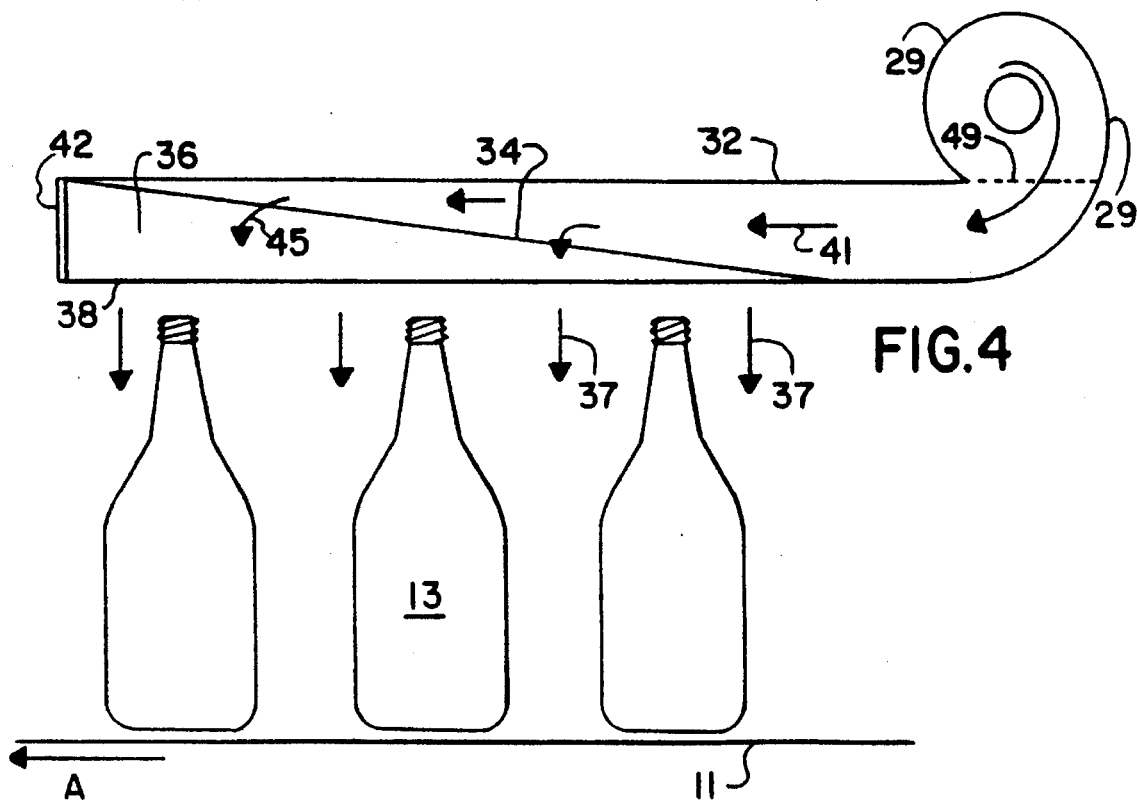
FIG. 4 shows a sectional view of the apparatus of the invention.

In FIG. 4, the present invention is shown as comprising relocated blower 29 which delivers process air or other suitable fluid 41 into an end, as opposed to between the ends, of plenum upper chamber 32; the air passes first through attenuator plate 34 into plenum lower chamber 36, and then through diffuser plate 38 to provide a substantially uniform stream of process air 41 into the finish region of bottles 13. Clean-out means 42 provides access to the interior of plenum upper chamber 32 and plenum lower chamber 36 for removing, replacing or servicing attenuator plate 34 and diffuser plate 38 as may be appropriate or necessary. It has been found preferable to position attenuator 34 substantially at an angle to the flow of process fluid as shown in FIG. 4; it is our understanding of the operation of this invention that the fluid, in passing through attenuator 34, is redirected in a plurality of small, low-energy jets 45 without the generation of substantial turbulence or formation of standing waves, and the subsequent passage of that fluid through diffuser plate 38 is quite uniform.

With the availability of a uniform stream of non-turbulent process fluid, it is then possible to adjust the flow rate of that stream with sufficient precision to maintain a zone free of coating material in the finish region without either starving the shoulder or body region of the ware being coated, or permitting the stream of coating material to rise into the finish region. That adjustment is represented by the uniform vector arrows 37 in FIG. 4. In the fashion described, the finish can be kept virtually free of coating, while the contact areas of the ware are provided with adequate coating. With the apparatus of this invention, we have been able to provide a uniform coating thickness of about 50Å on the body of a bottle, while the finish region was substantially uncoated.

Throttle means 49 in FIG. 4, such as, e.g., an iris valve, but chosen to avoid introducing turbulence into fluid stream 41, permits an additional method of controlling the force and velocity of stream 41, and therefore the force and velocity of jets 45. A similar or conjunctive control can be achieved by regulating the force of blower 29 by means not shown, but well known to those skilled in the art, and forming no part of this invention as such.

Figure 5:
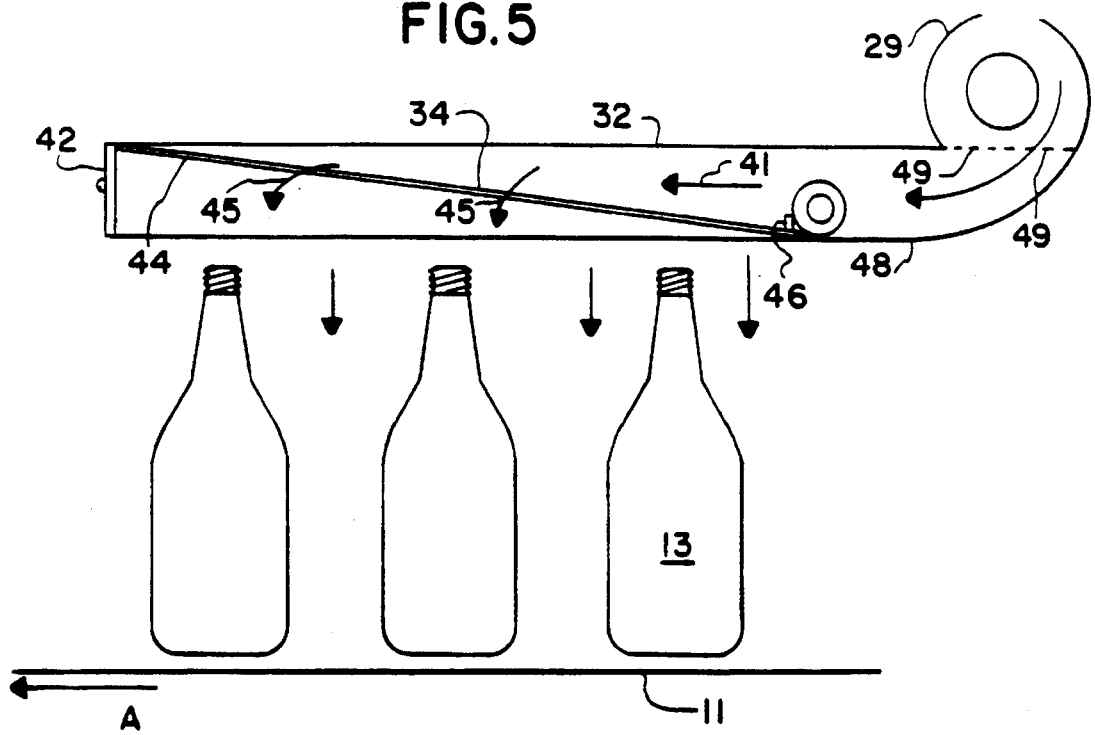
FIG. 5 is another embodiment of the apparatus shown in FIG. 4.

FIG. 5 shows another embodiment of the apparatus of the present invention, where attenuator 34 plate is juxtaposed adjacent auxiliary or supplementary attenuator plate 44; by this juxtaposition, any clogging of the passages in the attenuator plates can be easily remedied by opening clean-out 42 and replacing the attenuators, or by moving one past the other, thus causing mechanical friction to dislodge accumulated particles such as atmospheric dust or partially reacted or hydrolyzed coating compound. In the alternative, attenuators 34 and 44, or either, can be mounted in a fashion which would permit their substantially frequent or constant movement relative to each other, in order to maintain clean holes without the need for exterior manipulation. Such apparatus 46 can comprise, e.g., a motor having an eccentrically-mounted weight which would cause a low-amplitude vibration in attenuator 34, by direct attachment 46 to that attenuator, or any other motive means for inducing relative movement, well known to those skilled in the art, but forming no part of this invention as such. Within the scope and spirit of this invention, it is sufficient if the attenuators are of complementary shape, and juxtaposed closely enough to permit particulate removal by moving either attenuator with respect to the other. Further, filtration means, not shown but well known to those skilled in the art, can be supplied to remove particulate and other deleterious matter from the input fluid stream prior to that fluid being urged into or through plenum upper chamber 32.

Figure 6:
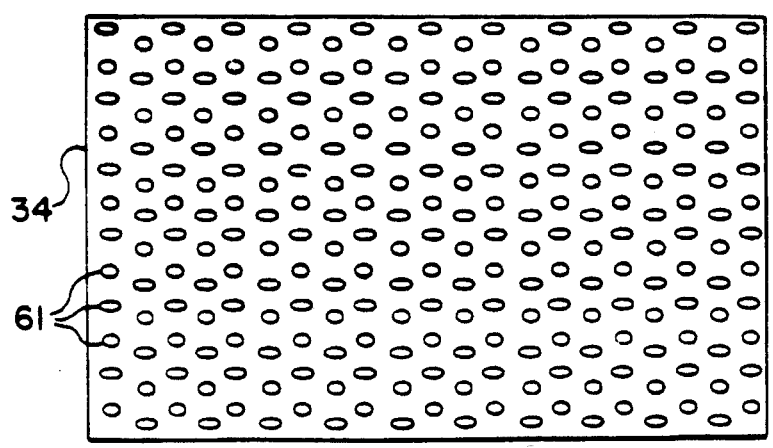
FIG. 6 is a plan view of the attenuator plate shown in FIGS. 4 and 5.

FIG. 6 is a plan view of attenuator plate 34, having a plurality of holes 61 therein, to permit the passage of process fluid, while moderating its velocity and changing its direction by up to 90°, in a plurality of low-energy jets 45. Attenuator 44 is substantially similar in design, and those skilled in the art will realize that that the shape of the holes 61 is not critical to the operation of the present invention, it being a sufficient condition that the size of the holes 61 be adequate to permit the passage of air, and that their spacing be chosen to prevent the development of extraneous currents between the individual jets 45.

By the use of the coating apparatus of the present invention, it has been found possible to establish parameters for coating-stream flow, exhaust velocity and bottle travel rate, and then to set the volume and velocity of the vertical finish-protection stream to provide substantially zero thickness of coating on the finish; thereafter, further adjustments to maintain the system in balance are virtually unnecessary.

Modifications and improvements to the preferred forms of the invention disclosed and described herein may occur to those skilled in the art who come to understand the principles and precepts hereof. Accordingly, the scope of the patent to be issued hereon should not be limited solely to the embodiments of the invention set forth herein, but rather should be limited only by the advance by which the invention has promoted the art.

What is claimed is:

1. In an apparatus for application of coating material to glass containers having sides and upper portions, the apparatus comprising a conveyor to move glass containers along a conveyor path, means for directing a coating flow containing coating precursor compound against the sides of the containers moving along the conveyor path, means for exhausting spent coating flow from the conveyor path, and means at an upper part of the conveyor path for blowing a diffuse non-coating flow distributed across and directed downward onto the glass containers moving along the conveyor path to inhibit coating of the upper portions of the containers, said means for blowing a diffuse non-coating flow comprising a plenum having a lower surface, a blower connected to the plenum for blowing said non-coating flow into the plenum and a diffuser plate containing holes located on the lower surface of said plenum to direct the non-coating flow downwardly onto the conveyor path, wherein the improvement comprises attenuator means positioned and arranged in the plenum so as to be inclined at an angle between vertical and horizontal for attenuating the non-coating flow in the plenum to obtain a substantially uniform flow and wherein the blower is positioned and arranged at an end of the plenum.

2. Apparatus according to claim 1 in which the plenum is divided by the attenuator means into an upper chamber connected to the blower and a lower chamber connected to the diffuser plate.

3. Apparatus according to claim 1 in which the blower is further positioned and arranged to blow the diffuse non-coating flow into the plenum in a direction other than a downward direction.

4. Apparatus according to claim 3 in which the blower is further positioned and arranged to blow the diffuse non-coating flow generally horizontally into the plenum.

5. Apparatus according to claim 1 in which the attenuator means comprises a plate having holes.

6. Apparatus according to claim 5 in which the attenuator means inclined at an angle between vertical and horizontal has an upper end and a lower end.

7. Apparatus according to claims 6 in which the attenuator means inclines up in the direction along the conveyor path, symmetrically with respect thereto, and the blower blows the non-coating flow into the plenum generally horizontally and at the lower end of the attenuator means.

8. Apparatus according to claim 1 in which agitating means is provided for mechanically agitating the attenuator means to inhibit the accumulation of deposits thereon.

9. Apparatus according to claim 8 in which the attenuator means comprises two superimposed plates and the agitating means is adapted to move the plates relative to one another.

10. Apparatus according to claim 1 in which the plenum has a clean-out means for providing access removing, replacing or servicing the attenuator means.

11. In a method of coating glass containers, comprising moving the containers along a conveyor path; blowing a coating stream containing coating precursor compound from at least one side of the conveyor path and against the containers moving along the conveyor path to coat them, and blowing a non-coating flow at upper portions of the containers to inhibit the coating of those upper portions, wherein the non-coating flow is blown down onto the containers on the conveyor path through a plenum and a diffuser plate having holes and wherein the improvement comprises attenuating the non-coating flow in the plenum by passing the non-coating flow through an attenuator means positioned and arranged in the plenum so as to be inclined at an angle between vertical and horizontal to obtain a substantially uniform non-coating flow.

12. A method according to claim 11 in which the coating precursor compound is a tin or titanium compound.

13. The method of claim 11 further comprising controlling velocity of the non-coating flow with throttle means.

* * * * *